(12) United States Patent
Hiura et al.

(10) Patent No.: US 8,513,046 B2
(45) Date of Patent: Aug. 20, 2013

(54) PHOTOELECTRIC CONVERSION DEVICE AND MANUFACTURING METHOD THEREOF

(75) Inventors: Yoshikazu Hiura, Kanagawa (JP); Fumito Isaka, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/252,299

(22) Filed: Oct. 4, 2011

(65) Prior Publication Data

US 2012/0086005 A1 Apr. 12, 2012

(30) Foreign Application Priority Data

Oct. 7, 2010 (JP) .................................. 2010-227215

(51) Int. Cl.
*H01L 21/00* (2006.01)
(52) U.S. Cl.
USPC .................................. 438/63; 438/93; 438/97
(58) Field of Classification Search
USPC .................. 438/57, 63, 89, 93, 94, 96, 97
See application file for complete search history.

(56) References Cited

U.S. PATENT DOCUMENTS

| | | | |
|---|---|---|---|
| 2007/0184191 A1* | 8/2007 | Takai et al. | 427/255.28 |
| 2009/0047752 A1 | 2/2009 | Yamazaki et al. | |
| 2010/0147379 A1* | 6/2010 | Kishimoto | 438/96 |
| 2011/0005331 A1 | 1/2011 | Wang et al. | |
| 2011/0053311 A1 | 3/2011 | Hiura et al. | |
| 2011/0053357 A1 | 3/2011 | Yamazaki | |
| 2011/0053358 A1 | 3/2011 | Toriumi et al. | |

FOREIGN PATENT DOCUMENTS

JP 2000-277439 10/2000

OTHER PUBLICATIONS

Komatsu et al., "Single Crystalline Silicon Solar Cells with High Effeciency of 23.5%", Sharp Technical Journal, vol. 70, Apr. 1, 1998, pp. 19-23.
Komatsu et al., "Single Crystalline Silicon Solar Cells with High Effeciency of 23.5%", Sharp Technical Journal, vol. 70, No. 10, Apr. 1, 1998, pp. 19-23.

* cited by examiner

*Primary Examiner* — Kevin M Picardat
(74) *Attorney, Agent, or Firm* — Nixon Peabody LLP; Jeffrey L. Costellia

(57) ABSTRACT

A photoelectric conversion device including a single crystal silicon substrate; a first amorphous silicon layer in contact with a surface (a light-receiving surface) of the single crystal silicon substrate; a first polarity (p-type) impurity diffusion layer in contact with the first amorphous silicon layer; a second amorphous silicon layer in contact with a back surface of the single crystal silicon substrate; and a second polarity (n-type) impurity diffusion layer in contact with the second amorphous silicon layer, in which the first and second polarity impurity diffusion layers are microcrystalline silicon layers formed under a deposition condition where a pressure in a reaction chamber is adjusted to be greater than or equal to 450 Pa and less than or equal to 10000 Pa is provided.

24 Claims, 2 Drawing Sheets

PHOTOELECTRIC CONVERSION DEVICE AND MANUFACTURING METHOD THEREOF

BACKGROUND OF THE INVENTION

1. Field of the Invention

One embodiment of the present invention relates to a photoelectric conversion device including a single crystal silicon wafer and a manufacturing method thereof.

2. Description of the Related Art

A photoelectric conversion device has been developed in which microcrystalline silicon, which is crystalline silicon capable of being formed by a plasma CVD method, is used for a semiconductor film having a function of photoelectric conversion (e.g., see Patent Document 1).

REFERENCE

Patent Document

[Patent Document 1] Japanese Published Patent Application No. 2000-277439

SUMMARY OF THE INVENTION

In order to increase photoelectric conversion efficiency of a photoelectric conversion device typified by a solar cell, it is preferable to make the lifetime of a minority carrier in a single crystal silicon wafer longer.

An object of one embodiment of the present invention is to provide a manufacturing method of a photoelectric conversion device in which the lifetime of a minority carrier in a single crystal silicon wafer is long.

One embodiment of the present invention is a solar cell including a single crystal silicon substrate; a first amorphous silicon layer in contact with a surface (a light-receiving surface) of the single crystal silicon substrate; a first polarity (p-type) impurity diffusion layer in contact with the first amorphous silicon layer; a second amorphous silicon layer in contact with a back surface of the single crystal silicon substrate; and a second polarity (n-type) impurity diffusion layer in contact with the second amorphous silicon layer. A feature of one embodiment of the present invention is that the first polarity impurity diffusion layer and the second polarity impurity diffusion layer are microcrystalline silicon layers formed under a deposition condition where a pressure in a reaction chamber is adjusted to be greater than or equal to 450 Pa and less than or equal to 10000 Pa.

The microcrystalline silicon layer which is an n-type impurity diffusion layer is formed by glow discharge plasma with a mixture of a deposition gas containing silicon, hydrogen, and phosphine (diluted with hydrogen or silane) in a reaction chamber of a plasma CVD apparatus. As an impurity element imparting n-type conductivity to a semiconductor, phosphorus is given, for example.

The microcrystalline silicon layer which is a p-type impurity diffusion layer is formed by glow discharge plasma with a mixture of a deposition gas containing silicon, hydrogen, and diborane (diluted with hydrogen or silane) in the reaction chamber of the plasma CVD apparatus. As an impurity element imparting p-type conductivity to a semiconductor, boron is given, for example.

It is difficult to form a microcrystalline silicon layer in contact with a single crystal silicon substrate; therefore, an i-type amorphous silicon layer is provided between the microcrystalline silicon layer and the single crystal silicon substrate, which is another feature of one embodiment of the present invention.

Note that the single crystal silicon substrate is one kind of single crystal semiconductor substrate, and an n-type single crystal silicon substrate formed by a floating zone (FZ) method. There is no particular limitation on a method for forming the single crystal silicon substrate, and for example, the single crystal silicon substrate may be formed by a Czochralski (CZ) method typified by a magnetic CZ (MCZ) method.

The photoelectric conversion device can have higher photoelectric conversion efficiency because the lifetime of a minority carrier in the single crystal silicon wafer can be longer.

DETAILED DESCRIPTION OF THE INVENTION

Hereinafter, an embodiment and an example of the present invention will be described in detail with reference to the accompanying drawings. However, the present invention is not limited to the following description, and it is easily understood by those skilled in the art that modes and details disclosed herein can be modified in various ways. Therefore, the present invention is not construed as being limited to description of the embodiment and the example described below.

Embodiment 1

Figure 1:
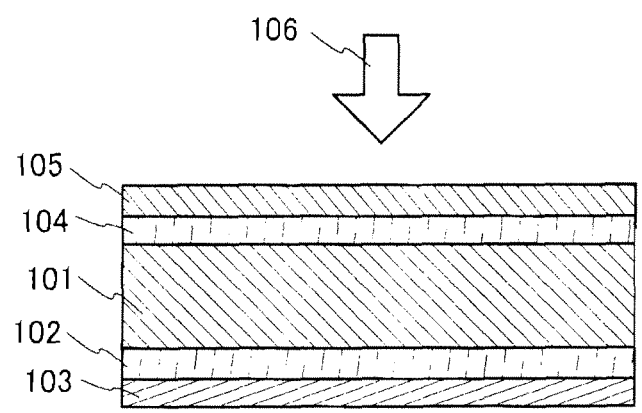
FIG. 1 is a cross-sectional view illustrating one embodiment of the present invention.

FIG. 1 shows an example of a cross-sectional view of a photoelectric conversion device described in this embodiment.

The photoelectric conversion device illustrated in FIG. 1 includes a first amorphous silicon layer 104 in contact with a light-receiving surface of a semiconductor wafer 101, a first polarity impurity diffusion layer 105 in contact with the first amorphous silicon layer, a second amorphous silicon layer 102 in contact with a back surface of the semiconductor wafer 101, and a second polarity impurity diffusion layer 103 in contact with the second amorphous silicon layer. Note that in order to clearly show the light-receiving surface, an incident light 106 is illustrated in FIG. 1.

A manufacturing method of the photoelectric conversion device illustrated in FIG. 1 is described below.

First, the second amorphous silicon layer 102 is formed on one surface of the semiconductor wafer 101 by a plasma CVD method. The thickness of the second amorphous silicon layer 102 is set to greater than or equal to 3 nm and less than or equal to 50 nm. The deposition conditions are as follows: a monosilane gas is introduced into a reaction chamber at a flow rate of greater than or equal to 5 sccm and less than or equal to 200 sccm; the pressure in the reaction chamber is greater than or equal to 10 Pa and less than or equal to 100 Pa; and the gap distance (a distance between a dielectric and the substrate) is greater than or equal to 15 mm and less than or equal to 40 mm.

Next, the second polarity impurity diffusion layer 103 is formed in contact with the second amorphous silicon layer 102. The second polarity impurity diffusion layer 103 is a microcrystalline silicon layer formed by a plasma CVD method, and the thickness thereof is greater than or equal to 3 nm and less than or equal to 50 nm. The deposition condition of the second polarity impurity diffusion layer 103 is that the pressure in the reaction chamber is set to greater than or equal to 450 Pa and less than or equal to 10000 Pa.

Next, the first amorphous silicon layer 104 is formed on one surface (a light-receiving surface) of the semiconductor wafer 101 by a plasma CVD method. The thickness of the first amorphous silicon layer 104 is set to greater than or equal to 3 nm and less than or equal to 50 nm. The deposition conditions are as follows: a monosilane gas is introduced into a reaction chamber at a flow rate of greater than or equal to 5 sccm and less than or equal to 200 sccm; the pressure in the reaction chamber is greater than or equal to 10 Pa and less than or equal to 100 Pa; and the gap distance is greater than or equal to 15 mm and less than or equal to 40 mm.

Then, the first polarity impurity diffusion layer 105 is formed in contact with the first amorphous silicon layer 104. The first polarity impurity diffusion layer 105 is a microcrystalline silicon layer formed by a plasma CVD method, and the thickness thereof is greater than or equal to 3 nm and less than or equal to 50 nm. The deposition condition of the first polarity impurity diffusion layer 105 is that the pressure in the reaction chamber is set to greater than or equal to 450 Pa and less than or equal to 10000 Pa.

Through the above process, the photoelectric conversion device illustrated in FIG. 1 can be manufactured. If necessary, an electrode in contact with the first polarity impurity diffusion layer 105, or an electrode in contact with the second polarity impurity diffusion layer 103 may be formed.

The thus obtained photoelectric conversion device can have higher photoelectric conversion efficiency because the lifetime of a minority carrier in the semiconductor wafer 101 can be longer.

Further, the light-receiving surface may be provided with a texture structure or the like. Accordingly, the photoelectric conversion efficiency can be improved.

Example 1

In order to compare of lifetimes, samples are manufactured and the lifetimes thereof are compared. In this example, a lifetime measurement system manufactured by SEMILAB Co. Ltd. (product name: WT-2000), in which a microwave photoconductive decay method is employed, is used as a measuring apparatus.

A microwave photoconductive decay method (hereinafter referred to as a µ-PCD method) is a method for evaluating a lifetime in the following manner. A surface of a semiconductor is irradiated with a laser beam to generate carriers in the semiconductor, a portion irradiated with the laser beam in the semiconductor is irradiated with a microwave, and a state of intensity decay of the microwave reflected by the semiconductor is detected. The µ-PCD method utilizes the phenomenon in which since the resistance value of a semiconductor is decreased when carriers are generated in the semiconductor, the reflectivity of a microwave is increased in a region of the semiconductor where carriers are generated. Accordingly, in the µ-PCD method, the lifetime is evaluated by detecting the intensity of the reflected microwave.

Upon irradiation of single crystal silicon with light, electrons generated in a valence band and holes generated in a conduction band are recombined and annihilated. When a single crystal silicon layer has a large number of contaminated portions or defects, the density of the charge trap center becomes high. Thus, the probability of the recombination of carriers in single crystal silicon becomes high; accordingly, the lifetime is shortened. Therefore, the lifetime is utilized as a parameter for evaluating whether a crystal structure of a semiconductor such as single crystal silicon is complete.

As a single crystal silicon wafer used for manufacturing a sample, a 280-µm-thick n-type single crystal silicon wafer manufactured by an FZ method is used. A stacked structure of Sample 1, which is the same as that of FIG. 1, is manufactured in the following manner.

First, the second amorphous silicon layer 102 is formed on one surface of the single crystal silicon wafer by a plasma CVD method. The thickness of the second amorphous silicon layer 102 is set to greater than or equal to 3 nm and less than or equal to 50 nm. Here, the thickness is set to 10 nm. The deposition conditions are as follows: a monosilane gas is introduced into a reaction chamber at a flow rate of 10 sccm; the pressure in the reaction chamber is 15 Pa; the deposition temperature is 200° C.; the RF power output is 11 W; the power frequency is 13.56 MHz; and the gap distance (a distance between a dielectric and the substrate) is 30 mm.

Next, the second polarity impurity diffusion layer 103 is formed in contact with the second amorphous silicon layer 102. The thickness of the second polarity impurity diffusion layer 103 is set to greater than or equal to 3 nm and less than or equal to 50 nm. Here, the thickness is set to 10 nm. The deposition conditions are as follows: a monosilane gas at a flow rate of 2 sccm, a hydrogen gas at a flow rate of 1985 sccm, and a phosphine gas (a flow rate: 15 sccm) using a gas cylinder of a phosphine gas diluted with hydrogen so that the concentration of the phosphine gas in the cylinder is 0.5% are introduced into a reaction chamber; the pressure in the reaction chamber is 1330 Pa; the deposition temperature is 200° C.; the RF power output is 150 W; the power frequency is 13.56 MHz; and the gap interval is 18 mm.

Next, the first amorphous silicon layer 104 is formed on the other surface (a light-receiving surface) of the single crystal silicon wafer by a plasma CVD method. The thickness of the first amorphous silicon layer 104 is set to greater than or equal to 3 nm and less than or equal to 50 nm. Here, the thickness is set to 10 nm. The deposition conditions are as follows: a monosilane gas is introduced into a reaction chamber at a flow rate of 10 sccm; the pressure in the reaction chamber is 15 Pa; the deposition temperature is 200° C.; the RF power output is 11 W; the power frequency is 13.56 MHz; and the gap interval is 30 mm.

Next, the first polarity impurity diffusion layer 105 is formed in contact with the first amorphous silicon layer 104. The thickness of the first polarity impurity diffusion layer 105 is set to greater than or equal to 3 nm and less than or equal to 50 nm. Here, the thickness is set to 10 nm. The deposition conditions are as follows: a monosilane gas at a flow rate of 2 sccm, a hydrogen gas at a flow rate of 2000 sccm, and a diborane gas (a flow rate: 15 sccm) are introduced into a reaction chamber; the pressure in the reaction chamber is 1330 Pa; the deposition temperature is 200° C.; the RF power output is 150 W; the power frequency is 13.56 MHz; and the gap interval is 18 mm.

Sample 1 is manufactured through the above steps, and the lifetime is evaluated. The lifetime reflects both the surface recombination rate and the bulk lifetime. The lifetime of a 2-inch semiconductor wafer is evaluated. The average value, the MAX value, and the MIN value at five points on the semiconductor wafer are evaluated. The results are shown in Table 1.

TABLE 1

| | Lifetime (μsec) | MIN (μsec) | MAX (μsec) |
|---|---|---|---|
| Sample 1 | 4986 | 2678 | 5966 |
| Comparative Example 1 | 1046 | — | — |
| Comparative Example 2 | 1193 | 526 | 1930 |

Note that Comparative Example 1 is a sample in which an amorphous silicon layer is not provided, an impurity (p-type) diffusion layer is formed under a pressure in a reaction chamber of less than or equal to 100 Pa to be in contact with one surface of a semiconductor wafer, and an impurity (n-type) diffusion layer is formed to be in contact with the other surface of the semiconductor wafer.

Comparative Example 2 is a sample in which a semiconductor wafer is thermally oxidized to form a thermal oxide film on a top surface and a back surface.

Figure 2:
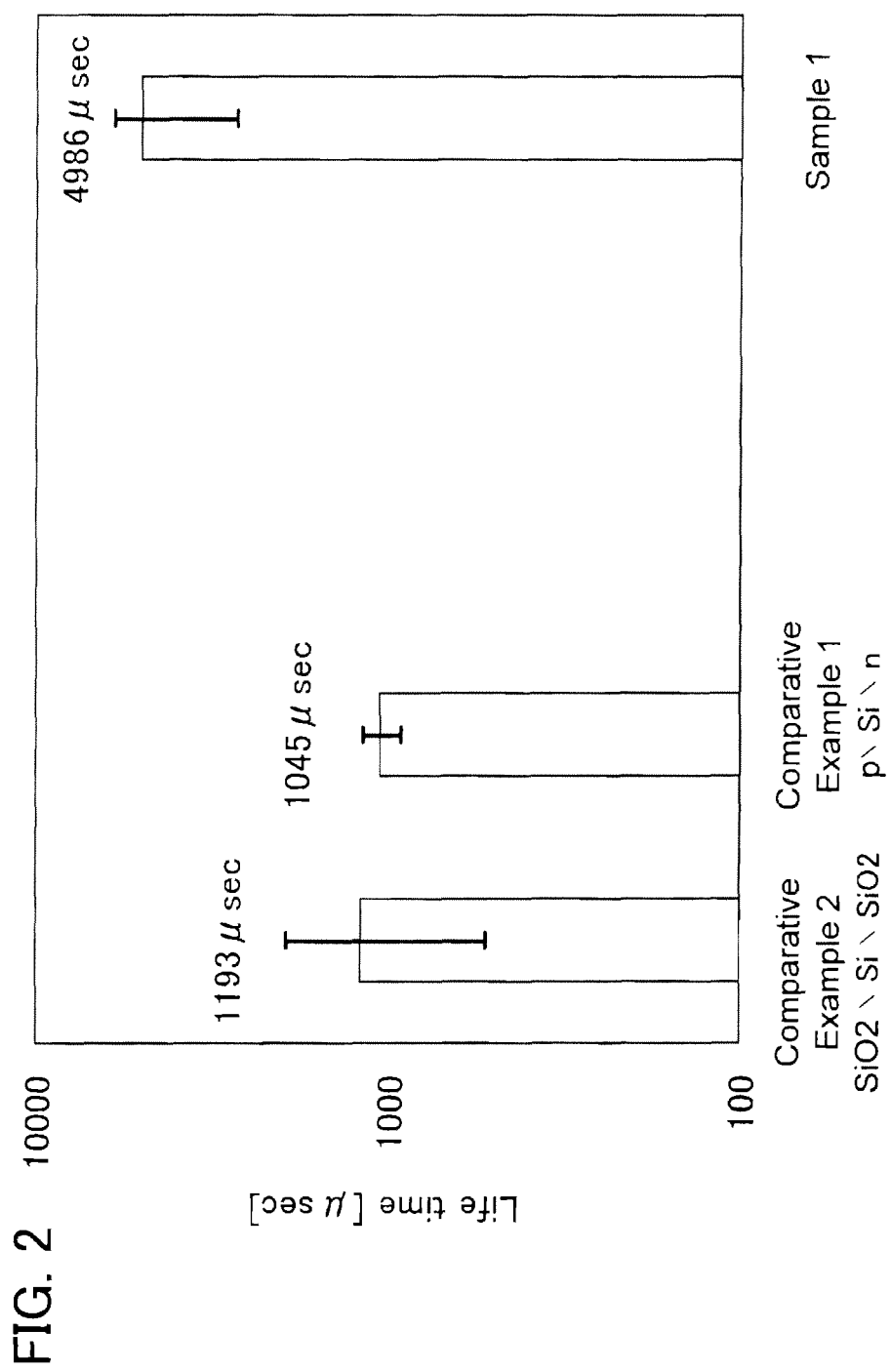
FIG. 2 is a graph showing measurement results of lifetimes of a structure of one embodiment of the present invention (Sample 1) and a comparative example.

FIG. 2 is a graph showing the results of those samples.

The lifetime of Sample 1 is significantly long as compared with the lifetimes of Comparative Examples 1 and 2. Thus, the photoelectric conversion efficiency of the photoelectric conversion device which is manufactured by a manufacturing method the same as that of Sample 1 can be improved.

This application is based on Japanese Patent Application serial no. 2010-227215 filed with Japan Patent Office on Oct. 7, 2010, the entire contents of which are hereby incorporated by reference.

What is claimed is:

1. A manufacturing method of a photoelectric conversion device, comprising the steps of:
   forming a first amorphous silicon layer in contact with a first surface of a single crystal semiconductor substrate; and
   forming a first microcrystalline silicon layer by a plasma CVD method in contact with the first amorphous silicon layer,
   wherein the first microcrystalline silicon layer is formed under a deposition condition where a pressure in a reaction chamber is greater than or equal to 450 Pa and less than or equal to 10000 Pa.

2. The manufacturing method of a photoelectric conversion device, according to claim 1, wherein the first microcrystalline silicon layer comprises a p-type impurity element.

3. The manufacturing method of a photoelectric conversion device, according to claim 1, wherein the first microcrystalline silicon layer comprises an n-type impurity element.

4. The manufacturing method of a photoelectric conversion device according to claim 1, further comprising a step of forming an electrode in contact with the first microcrystalline silicon layer.

5. The manufacturing method of a photoelectric conversion device according to claim 1, further comprising steps of:
   forming a second amorphous silicon layer in contact with a second surface of the single crystal semiconductor substrate; and
   forming a second microcrystalline silicon layer in contact with the second amorphous silicon layer,
   wherein the second microcrystalline silicon layer is formed under a deposition condition where a pressure in the reaction chamber is greater than or equal to 450 Pa and less than or equal to 10000 Pa.

6. The manufacturing method of a photoelectric conversion device, according to claim 5, wherein the second microcrystalline silicon layer comprises an n-type impurity element.

7. The manufacturing method of a photoelectric conversion device, according to claim 5, wherein the second microcrystalline silicon layer comprises an p-type impurity element.

8. The manufacturing method of a photoelectric conversion device according to claim 5, further comprising steps of:
   forming a first electrode in contact with the first microcrystalline silicon layer; and
   forming a second electrode in contact with the second microcrystalline silicon layer.

9. The manufacturing method of a photoelectric conversion device, according to claim 5, wherein the first surface and the second surface are a top surface and a back surface of the single crystal semiconductor substrate, respectively.

10. A manufacturing method of a photoelectric conversion device, comprising the steps of:
    forming a first amorphous silicon layer in contact with a first surface of a single crystal semiconductor substrate;
    forming a first polarity impurity diffusion layer in contact with the first amorphous silicon layer;
    forming a second amorphous silicon layer in contact with a second surface of the single crystal semiconductor substrate; and
    forming a second polarity impurity diffusion layer in contact with the second amorphous silicon layer,
    wherein the first polarity impurity diffusion layer and the second polarity impurity diffusion layer are formed under a deposition condition where a pressure in a reaction chamber is greater than or equal to 450 Pa and less than or equal to 10000 Pa.

11. The manufacturing method of a photoelectric conversion device, according to claim 10, wherein the first polarity impurity diffusion layer comprises a p-type impurity element.

12. The manufacturing method of a photoelectric conversion device, according to claim 10, wherein the second polarity impurity diffusion layer comprises an n-type impurity element.

13. The manufacturing method of a photoelectric conversion device, according to claim 10, wherein the first polarity impurity diffusion layer comprises a first microcrystalline silicon layer.

14. The manufacturing method of a photoelectric conversion device, according to claim 10, wherein the second polarity impurity diffusion layer comprises a second microcrystalline silicon layer.

15. The manufacturing method of a photoelectric conversion device according to claim 10, further comprising steps of:
    forming a first electrode in contact with the first polarity impurity diffusion layer; and
    forming a second electrode in contact with the second polarity impurity diffusion layer.

16. The manufacturing method of a photoelectric conversion device, according to claim 10, wherein the first surface and the second surface are a top surface and a back surface of the single crystal semiconductor substrate, respectively.

17. A manufacturing method of a photoelectric conversion device, comprising the steps of:
    forming a first amorphous silicon layer in contact with a light-receiving surface of a single crystal semiconductor substrate;
    forming a first microcrystalline silicon layer in contact with the first amorphous silicon layer;
    forming a second amorphous silicon layer in contact with a back surface of the single crystal semiconductor substrate; and
    forming a second microcrystalline silicon layer in contact with the second amorphous silicon layer, wherein the first microcrystalline silicon layer and the second microcrystalline silicon layer are formed under a deposition condition where a pressure in a reaction chamber is greater than or equal to 450 Pa and less than or equal to 10000 Pa.

18. The manufacturing method of a photoelectric conversion device, according to claim 17, wherein the first microcrystalline silicon layer comprises a p-type impurity element.

19. The manufacturing method of a photoelectric conversion device, according to claim 17, wherein the second microcrystalline silicon layer comprises an n-type impurity element.

20. The manufacturing method of a photoelectric conversion device according to claim 17, further comprising steps of:
   forming a first electrode in contact with the first microcrystalline silicon layer; and
   forming a second electrode in contact with the first microcrystalline silicon layer.

21. A manufacturing method of a photoelectric conversion device, comprising the steps of:
   forming a first amorphous silicon layer in contact with a light-receiving surface of a single crystal semiconductor substrate;
   forming a first polarity impurity diffusion layer in contact with the first amorphous silicon layer;
   forming a second amorphous silicon layer in contact with a back surface of the single crystal semiconductor substrate; and
   forming a second polarity impurity diffusion layer in contact with the second amorphous silicon layer,
   wherein the first polarity impurity diffusion layer and the second polarity impurity diffusion layer are formed under a deposition condition where a pressure in a reaction chamber is greater than or equal to 450 Pa and less than or equal to 10000 Pa.

22. The manufacturing method of a photoelectric conversion device, according to claim 21, wherein the first polarity impurity diffusion layer comprises a p-type impurity element.

23. The manufacturing method of a photoelectric conversion device, according to claim 21, wherein the second polarity impurity diffusion layer comprises an n-type impurity element.

24. The manufacturing method of a photoelectric conversion device according to claim 21, further comprising steps of:
   forming a first electrode in contact with the first polarity impurity diffusion layer; and
   forming a second electrode in contact with the second polarity impurity diffusion layer.

* * * * *